(12) United States Patent
Tsironis (10) Patent No.: US 10,734,697 B1
(45) Date of Patent: Aug. 4, 2020

(54) COAXIAL ADJUSTABLE WAVE PROBE

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 16/165,531

(22) Filed: Oct. 19, 2018

(51) Int. Cl.
| | |
|---|---|
| H03H 7/40 | (2006.01) |
| H01P 5/18 | (2006.01) |
| G01R 1/067 | (2006.01) |
| H01P 3/02 | (2006.01) |
| G01R 31/28 | (2006.01) |

(52) U.S. Cl.
CPC .......... *H01P 5/183* (2013.01); *G01R 1/06766* (2013.01); *H01P 3/02* (2013.01); *H03H 7/40* (2013.01); *G01R 31/2822* (2013.01)

(58) Field of Classification Search
CPC .. H03H 7/38; H03H 7/40; H01P 5/183; H01P 5/18; H01P 5/04; H01P 3/02; H01P 3/06; G01R 1/06772; G01R 1/06766; G01R 27/28; G01R 31/282
USPC ......... 333/263, 17.3, 32; 324/601, 637, 605, 324/244
See application file for complete search history.

(56) References Cited

U.S. PATENT DOCUMENTS

| | | |
|---|---|---|
| 7,282,926 B1 | 10/2007 | Verspecht et al. |
| 7,548,069 B2 | 6/2009 | Simpson |
| 8,841,921 B1 | 9/2014 | Tsironis |
| 10,276,910 B1 * | 4/2019 | Tsironis ................. H01P 5/183 |

OTHER PUBLICATIONS

Directional Couplers [online], Microwaves101 [retrieved on Oct. 17, 2018]. Retrieved from Internet <URL: http://www.microwaves101.com/encyclopedia/directionalcouplers.cfm>.
Sischka, Franz, "Basics of S-Parameters, part 1", Characterization handbook, Mar. 2002.
Stenarson, J. and Yhland K., IEEE Transactions on Microwave Theory and Techniques, vol. 49, No. 12, Dec. 2001, pp. 2567-2572.
Tucker, R.S. and Bradley P., "Computer-Aided Error Correction of Large-Signal Load-Pull Measurements", IEEE Transactions on Microwave Theory and Techniques, vol. MTT-32, No. 3, Mar. 1984, p. 296-300.
Fourier Transformation [online], Wikipedia [retrieved on Oct. 17, 2018] Retrieved from Internet <URL: http://en.wikipedia.org/wiki/Fourier_transform>.
"MPT, a Universal Multi-Purpose Tuner", Product Note 79, Focus Microwaves Inc., Oct. 2004.

* cited by examiner

*Primary Examiner* — Stephen E. Jones (57) ABSTRACT

Wideband coaxial low loss signal couplers use an electromagnetic loop placed perpendicularly in a mantle hole of the external wall of the coaxial airline. The signal coupling factor increases with frequency thus favoring detection of harmonic components generated by the nonlinearly operated RF transistors. In order to adapt also to various power levels and associated harmonic receiver sensitivity the coupling factor can be adjusted either by controlling the penetration of the loop inside the airline cavity or by rotating the loop around its vertical axis.

5 Claims, 14 Drawing Sheets

COAXIAL ADJUSTABLE WAVE PROBE

PRIORITY CLAIM

Not Applicable

CROSS-SEE REFERENCE TO RELATED ARTICLES

1. Directional Couplers [online], Microwaves101 [retrieved on 2018-10-17]. Retrieved from Internet <URL: http://www.microwaves101.com/encyclopedia/directionalcouplers.cfm>.
2. SISCHKA, Franz, "Basics of S-Parameters, part 1", Characterization handbook, March 2002.
3. SIMPSON, G. U.S. Pat. No. 7,548,069, "Signal measurement systems and methods".
4. STENARSON, J. and YHLAND K., IEEE Transactions on Microwave Theory and Techniques, Vol. 49, No 12, December 2001, pages 2567-2572.
5. VERSPECHT, J. et al. U.S. Pat. No. 7,282,926, "Method and an apparatus for characterizing a High-Frequency Device-Under-Test in a Large Signal Impedance Tuning Environment".
6. TUCKER, R. S. and BRADLEY P., "Computer-Aided Error Correction of Large-Signal Load-Pull Measurements", IEEE Transactions on Microwave Theory and Techniques, vol. MTT-32, No. 3, March 1984, p. 296-300.
7. Fourier Transformation [online], Wikipedia [retrieved on 2018-10-17] Retrieved from Internet <URL: http://en.wikipedia.org/wiki/Fourier_transform>.
8. "MPT, a Universal Multi-Purpose Tuner", Product Note 79, Focus Microwaves Inc., October 2004.
9. TSIRONIS, C. U.S. Pat. No. 8,841,921, "Adjustable signal sampling sensor and method".

BACKGROUND OF THE INVENTION

This invention relates to high power (nonlinear) testing of microwave transistors (DUT) in the frequency and time domain. When the transistor is driven in its nonlinear operation regime, a sinusoidal input electrical signal is deformed and the output signal contains harmonic components, described following Fourier's analysis of periodic non-sinusoidal time quantities. The electrical signals injected at the input of the DUT and extracted at the output can be sampled using signal sampling devices, such as signal couplers (see ref. 1), wave-probes (see ref. 5) or IV probes (see ref. 3) and processed by appropriate signal analyzers (see ref. 6).

DESCRIPTION OF PRIOR ART

Figure 1:
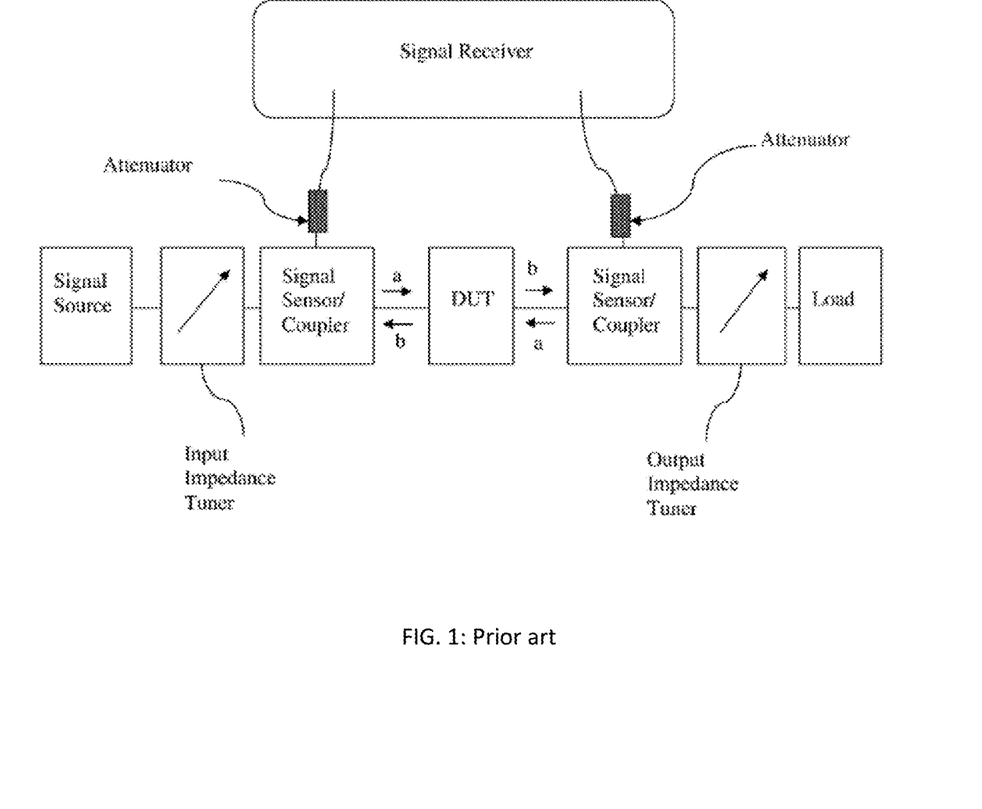
FIG. 1 depicts prior art, a signal measurement system using signal probing.

A typical test setup allowing sampling electrical signals at the input and output of a DUT in nonlinear operation regime is shown in FIG. 1. In this setup the source and load impedances are nominally 50Ω (the standard characteristic impedance Zo of microwave transmission lines today). The input and output signal couplers (known also as "wave-probes", FIG. 2) extract a small portion of the RF power waves a(t) and b(t) which are injected and extracted from the DUT and injects them into the tuned signal receiver, which measures the fundamental and harmonic components of it and may display the time function, using inverse Fourier transformation (see ref. 8).

The impedance tuners in the setup of FIG. 1 provide for source and/or load impedance control at the fundamental frequency Fo and, when appropriate, "harmonic impedance tuners" (see ref. 8) are also used for controlling the harmonic impedances at 2Fo, 3Fo etc. The tuners are used to synthesize and optimize the DUT's performance for certain criteria, such as output power, gain, power added efficiency, linearity etc.

From FIG. 1 follows that the level of power to measure at the harmonic receiver varies significantly depending on the DUT type and the operating power level, or gain compression level. The signal receivers themselves have a "dynamic range"; that is the input power range where their readings are calibrated and corrected. If this range is exceeded, either above a certain level, or below, the readings are wrong. For each type of DUT and one range of DUT power, this power imbalance can be adjusted using attenuators inserted into the cable between coupler and receiver (FIG. 1); but this requires disassembling the setup. A simpler method would be to use "adjustable" couplers. This can be achieved by modifying the position of the signal sensor inside the airline to adjust the coupling factor.

BRIEF DESCRIPTION OF THE INVENTION

Figure 6:
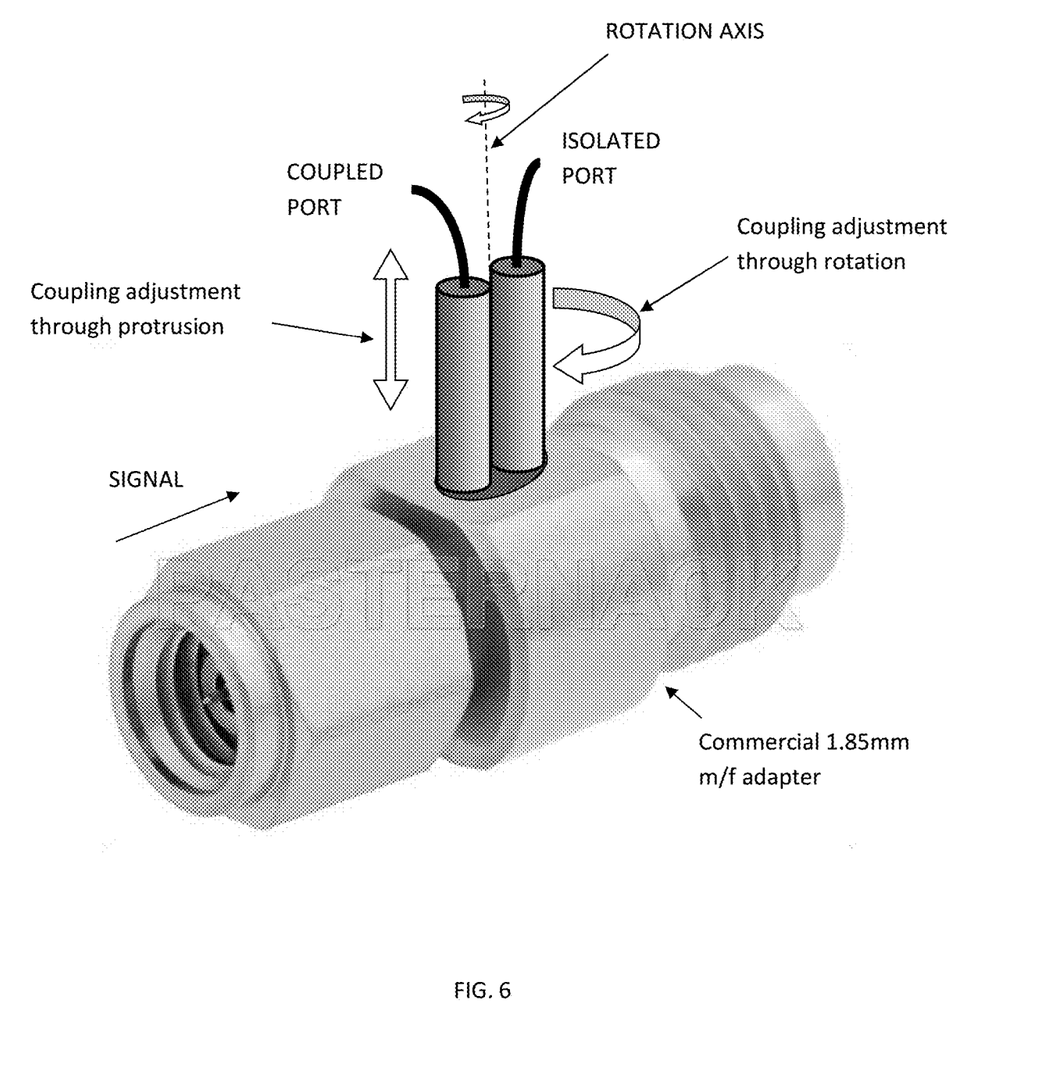
FIG. 6 depicts the signal coupler made using a commercially available 1.85 mm coaxial male to female adapter.
Figure 8:
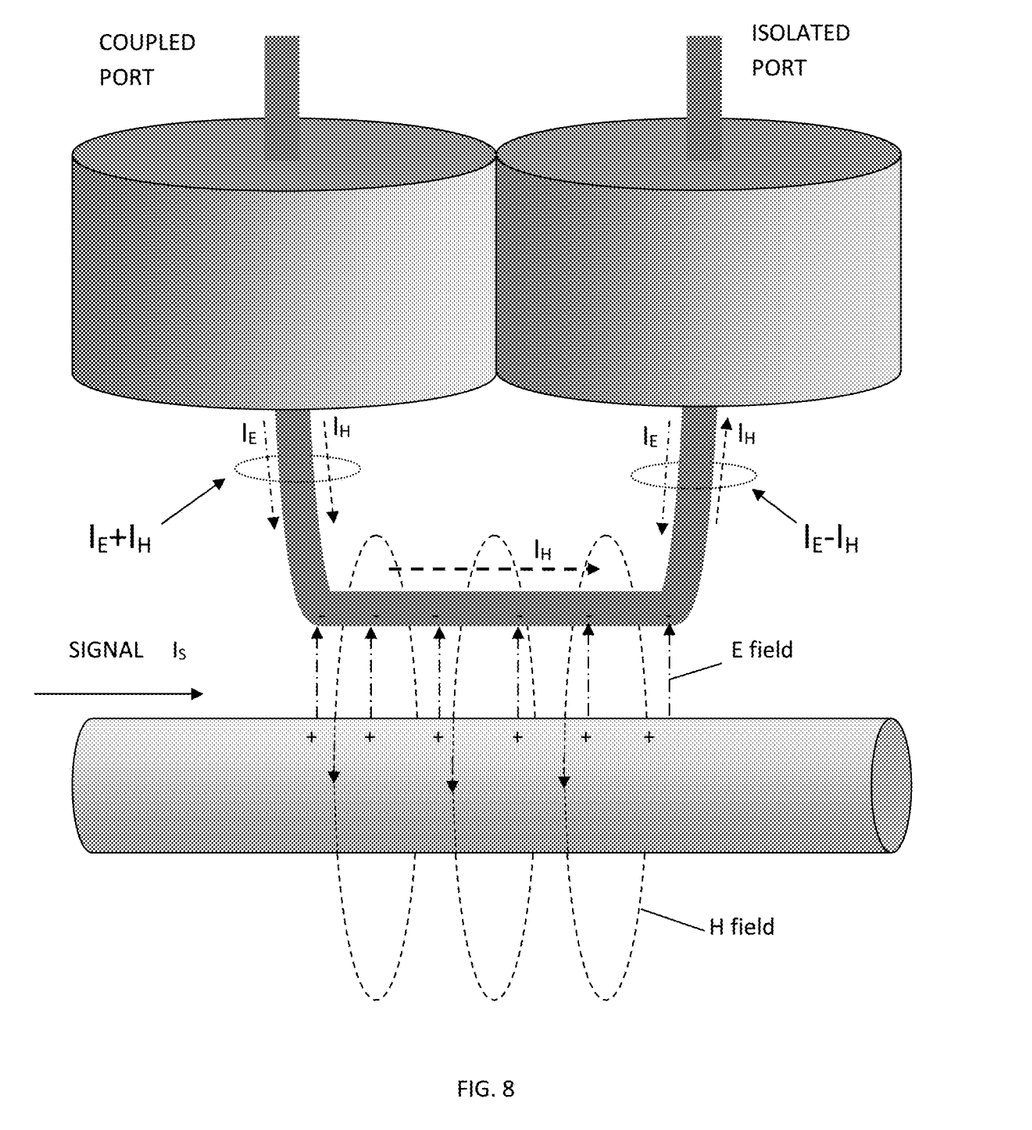
FIG. 8 depicts electric and magnetic field distribution and associated induced currents in a coaxial wave-probe.

This invention discloses a compact, wideband, integrated and adjustable signal coupler. The signal coupler is made of micro-coaxial semi-rigid cable of which the shielding mantle and dielectric (typically Teflon) core has been removed over a short section and the cable is folded at this section exposing the center conductor in "U" form. The cable with the "U" section in front is inserted into a radial slot of a coaxial airline and penetrates such that the exposed "U" center conductor segment is coupled electromagnetically with the signal travelling along the center conductor. The electrically and magnetically induced currents add in the coupled branch of the coupler and subtract in the isolated branch (FIG. 8). The difference (directivity) of the coupler in a coaxial transmission line environment is superior to similar couplers made in parallel-plate (slabline) environment. The structure is best suited for ultra-compact couplers, whereby the coaxial line may be a simple commercially available coaxial adapter (FIG. 6). In the following we use the term "coupler", "signal coupler" or "wave-probe" in equal terms, describing the same device. When loaded with impedance other than 50Ω the coupling behavior changes because, some signal, see reflected at the mismatched port leaks, through the finite directivity, into the coupled and isolated ports.

BRIEF DESCRIPTION OF THE SEVERAL VIEWS OF THE DRAWINGS

The invention and its mode of operation will be more clearly understood from the following detailed description when read with the appended drawings in which:

FIGS. 3A through 3B depict prior art: field distribution in a slabline-based wave-probe; FIG. 3A depicts front view; FIG. 3B depicts cross section.

FIGS. 11A through 11B depict the extreme coupling situations controlled by rotating the coupler loop: FIG. 11A depicts maximum electro-magnetic coupling and FIG. 11B depicts minimum electro-magnetic coupling.

DETAILED DESCRIPTION OF THE INVENTION

Figure 2:
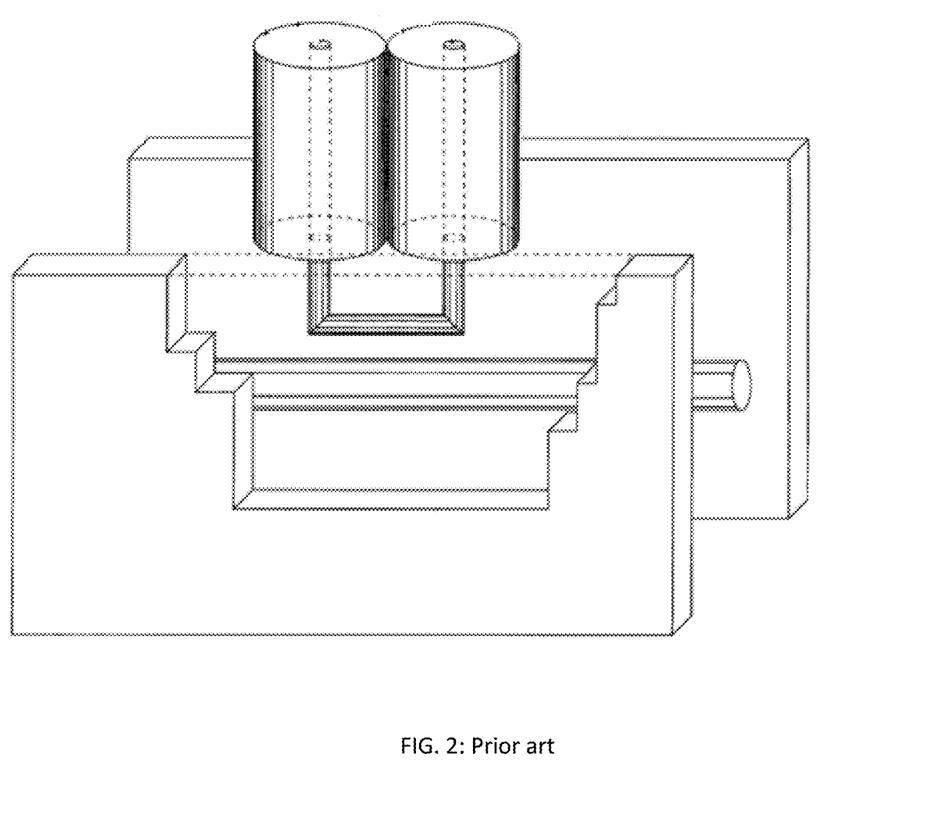
FIG. 2 depicts prior art, the concept of the wave-probe (see ref. 5).
Figure 3A:
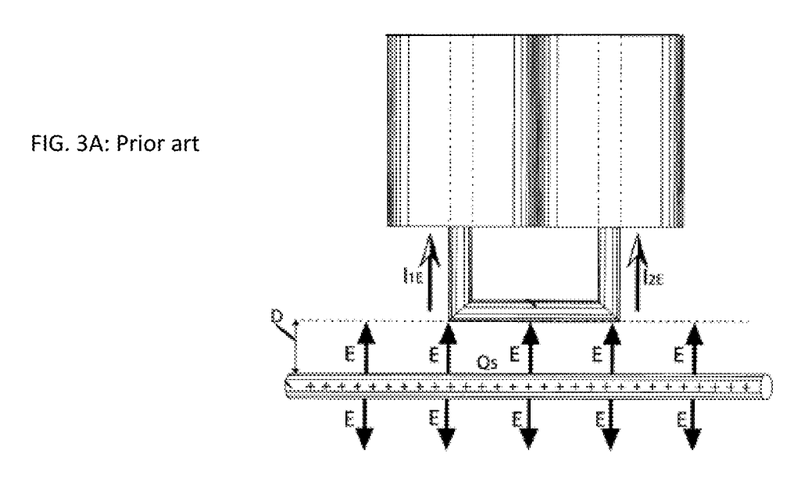
Figure 3B:
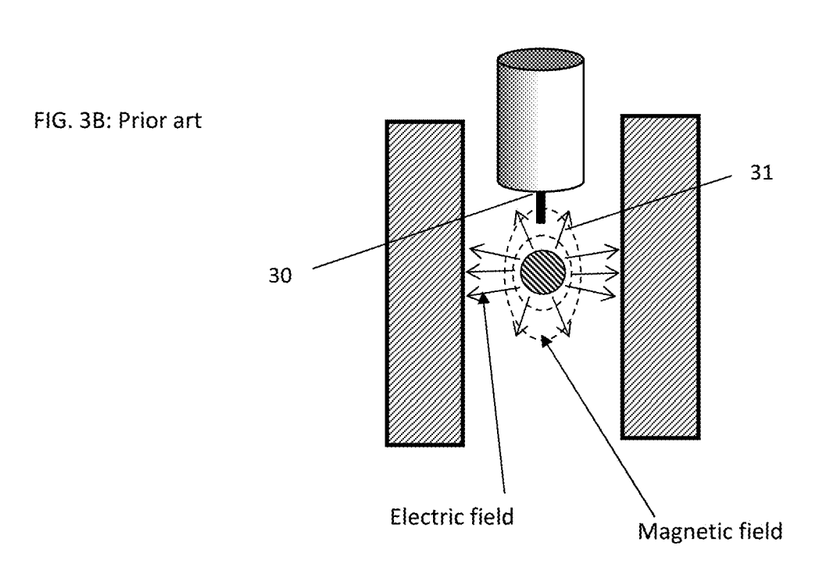

Electro-magnetically coupled signal detection sensors have been disclosed and used before (see ref. 5 and FIGS. 2 and 3). In prior art the signal couplers use parallel plate (slabline) configuration (see ref. 3, FIG. 3, see ref. 5, FIG. 3). The advantage of a slabline-based coupler is that there is no need for machining (drilling) the airline mantle to insert the coupling loop (30) into the hole, but there are shortcomings as well, such as the requirement for additional support hardware and weaker efficiency, because the electric field vertically (31) is weak, compared with the stronger coaxial electric field (50). To reach the same coupling a slabline loop (30) must penetrate deeper into the slabline than in the coaxial line risking the creation of higher field disturbance.

Figure 7:
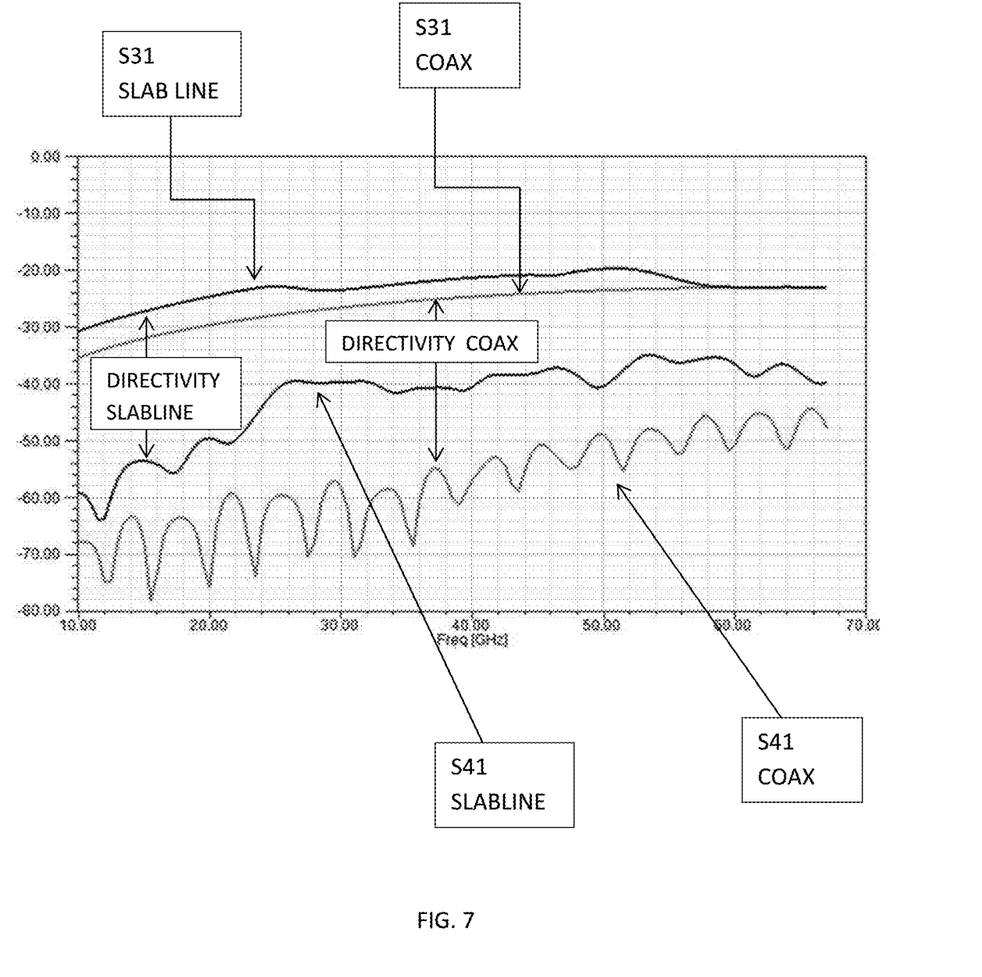
FIG. 7 depicts coupling factor and directivity of coaxial versus slabline based wave-probe.

Also, isolation (S41), see ref. 2 and 9, in the coaxial line coupler is higher than in the slabline coupler (FIG. 7). This is due to equal distribution of the stronger electrically induced current $I_E$ which adds up with the magnetically induced current $I_H$ in the coupled branch and subtracting in the isolated branch (FIG. 8). Said currents cannot be measured directly, only the signal ratio between the coupled and isolated port can be measured and it is proportional to the ratio $(I_E+I_H)/(I_H-I_E)$. Directivity decreases with frequency. This is obviously caused by parasitic capacitive coupling phenomena bypassing the core of the basic electro-magnetic coupling mechanism.

Figure 4:
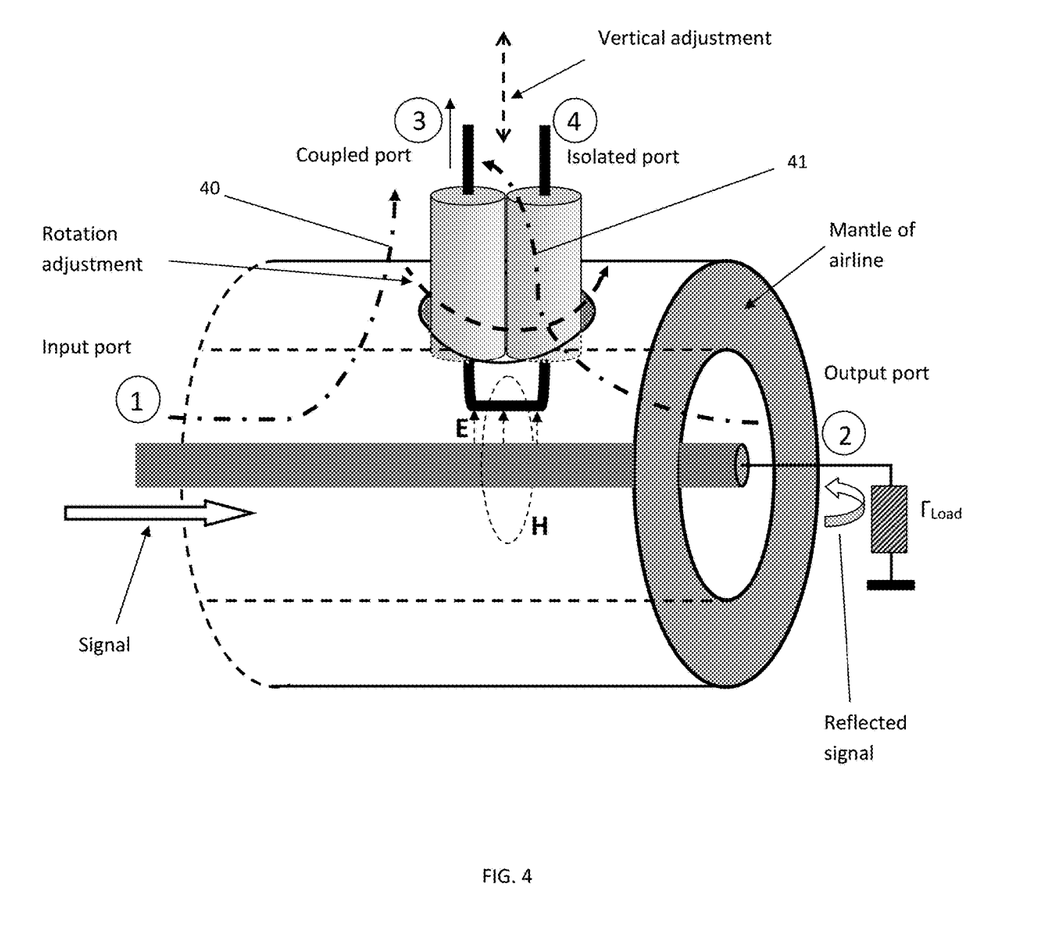
FIG. 4 depicts 3D view and electric and magnetic fields in coaxial wave-probe.
Figure 5:
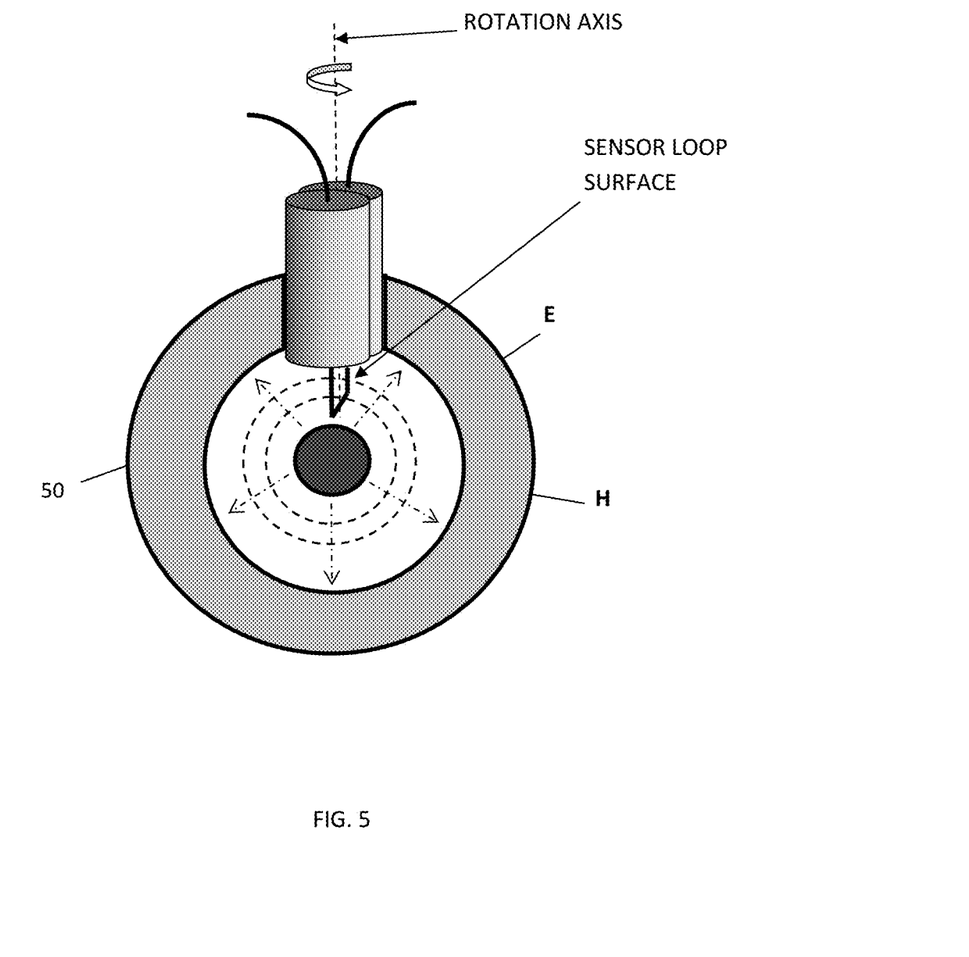
FIG. 5 depicts cross section of coaxial wave-probe and electric and magnetic fields.

All interconnections between RF components are in general coaxial. A coaxial signal coupler integrating seamlessly into a coaxial environment is, therefore, the natural solution. If, in a specific setup using a standard non-adjustable coupler, (see ref. 4), the signal generated by the DUT is too weak for the receiver sensitivity, then, a different coupler with higher coupling factor must be selected and the setup must be disassembled, re-assembled and re-calibrated. If the signal is too strong, then again, the cables to the receiver must be disconnected and attenuators must be inserted (FIG. 1). Also, the signal may be weak at the input and strong at the output of the device, further complicating the situation. The coupling factor of the herein disclosed coupler is easily adjustable (FIGS. 9 and 10) and, once adjusted, it only needs to be re-calibrated, without disassembling. The signal coupling factor increases with frequency, thus favoring detection of harmonic components which are generated by the nonlinearly operated RF transistors and, typically, decrease with frequency. In order to adapt to various power levels and associated harmonic receiver sensitivity (FIG. 1), instead of using external attenuators, the coupling factor can be adjusted either by controlling the penetration of the loop inside the airline cavity or by rotating the loop around its vertical axis (FIGS. 4 and 6).

Figure 9:
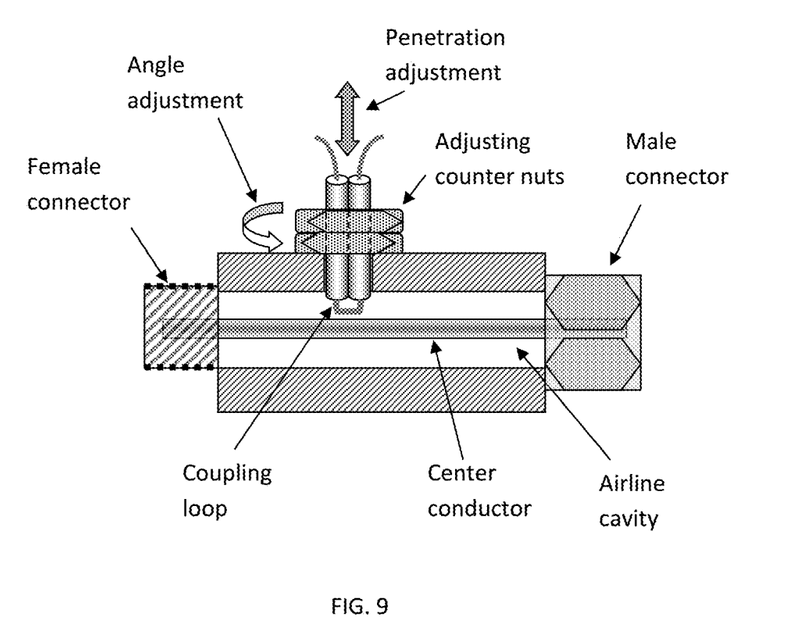
FIG. 9 depicts adjustable coaxial wave-probe integrated in female-male coaxial adapter.

FIG. 9 demonstrates one of the two methods for adjusting the coupling of the coaxial signal coupler. It comprises a vertical displacement of the magnetic loop inside the slot of the airline. As is shown in FIG. 8 the signal portion detected by the loop depends on the actual immersion of the sensor into the electric field and the amount of magnetic field captured by the inductive loop sensor. This can be made by inserting the magnetic loop deeper into the slot of the airline (or closer to the center conductor, where both, the magnetic and electric fields are stronger) using an adjusting nut (FIG. 9).

Figure 10:
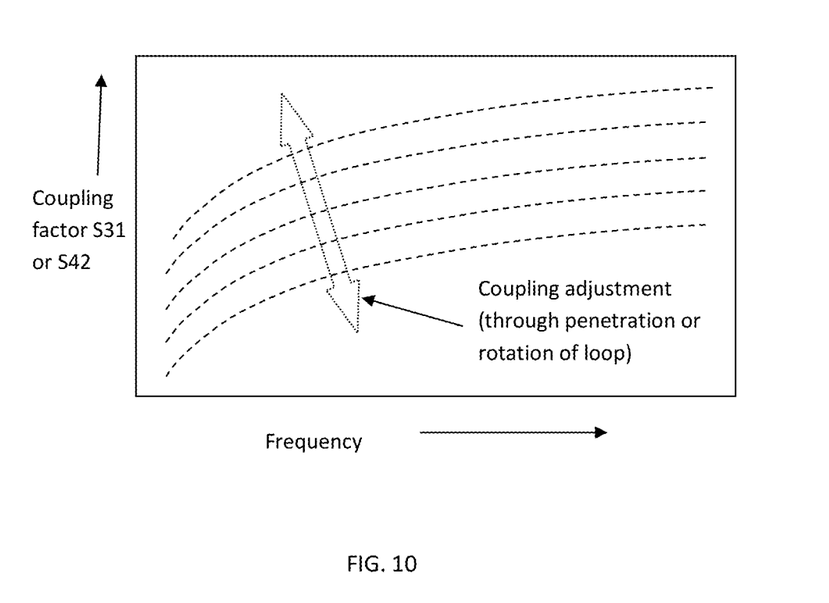
FIG. 10 depicts frequency dependence of adjustable coupling factor.
Figure 11A:
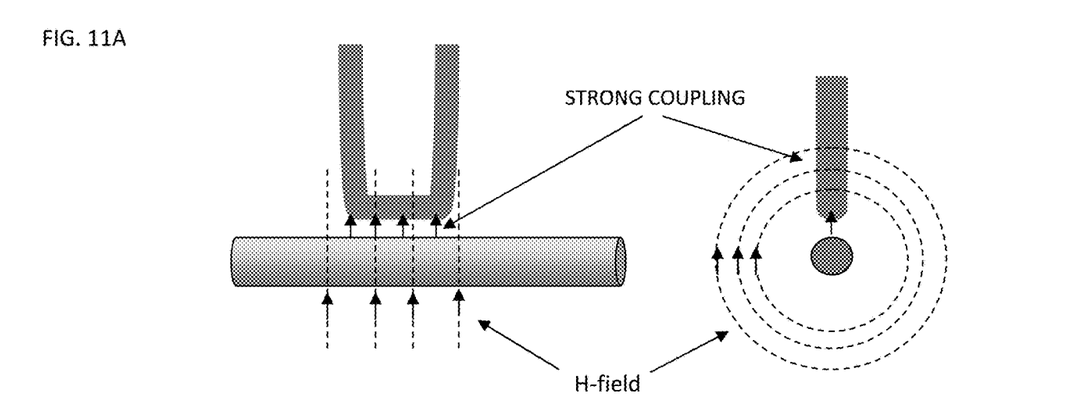
Figure 11B:
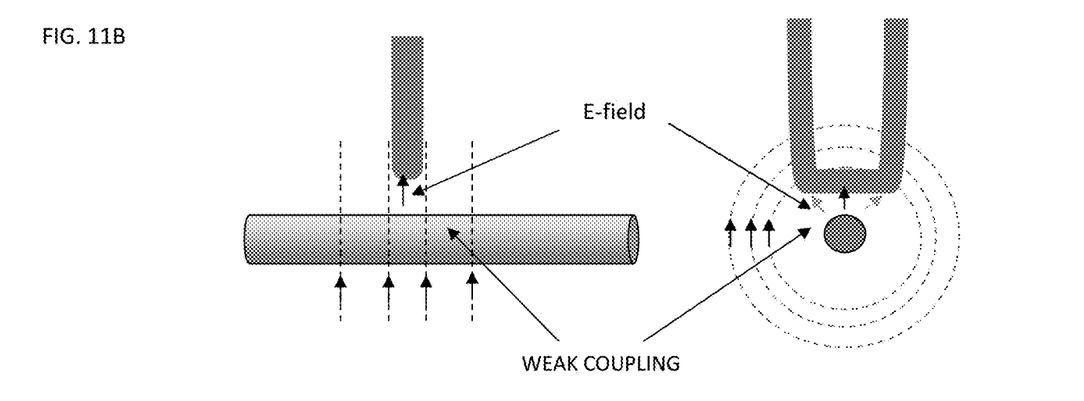

FIG. 10 shows the signal coupling factor between the input and coupling ports of the signal coupling device as a function of frequency and the degree of electro-magnetic coupling. Electro-magnetic coupling can be adjusted with mechanical position of the loop inside the hole in the airline wall. Whereas electric coupling is affected mostly by the degree of penetration of the coupling loop inside the airline and the proximity and capacitive coupling of the loop with the center conductor, the amount of captured magnetic flux is controlled by the effective surface of the loop against the magnetic field lines; this leads to the second method of controlling the coupling factor: i.e. by the angle between the loop surface and the center conductor (FIG. 11). When this angle is 0 degrees (loop is parallel with center conductor, FIG. 11A) a maximum magnetic flux and electric field are captured. When the surface of the loop is perpendicular (90 degree angle, FIG. 11B) to the center conductor, a minimum of either field is captured.

Figure 12:
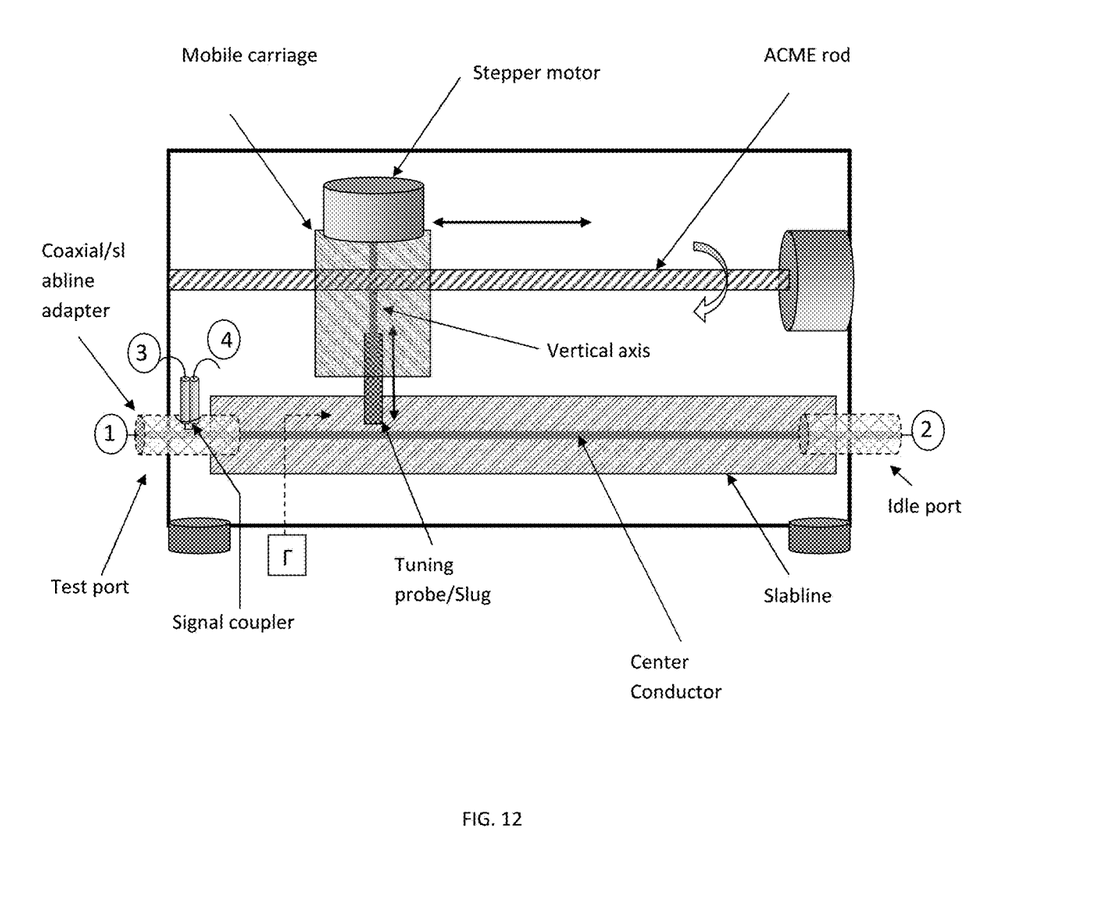
FIG. 12 depicts integration of coupler in impedance tuner with the coupler mounted on the test port side.
Figure 13:
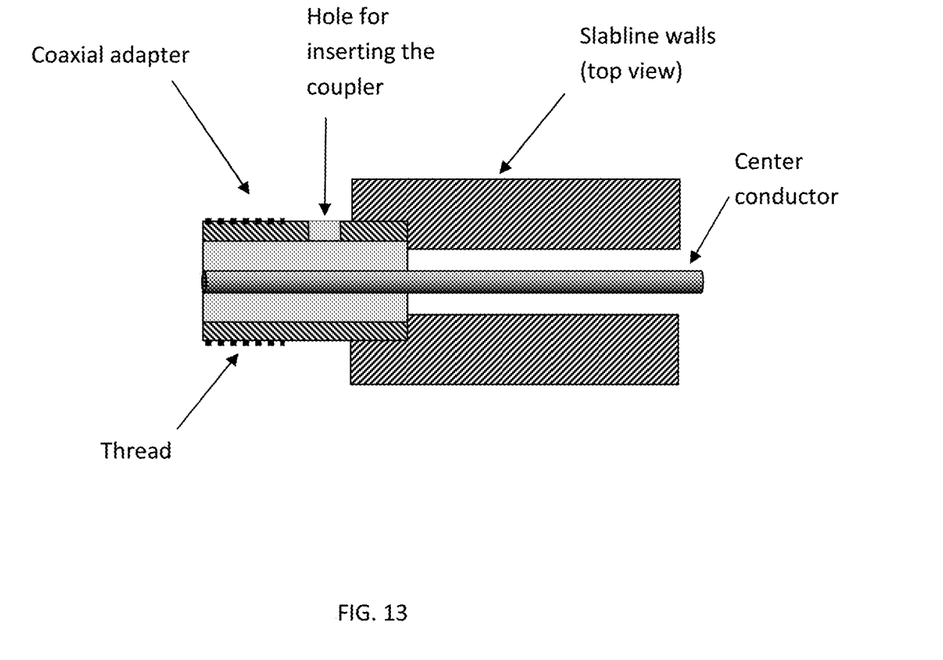
FIG. 13 depicts top view of coaxial-to-slabline adapter.
Figure 14:
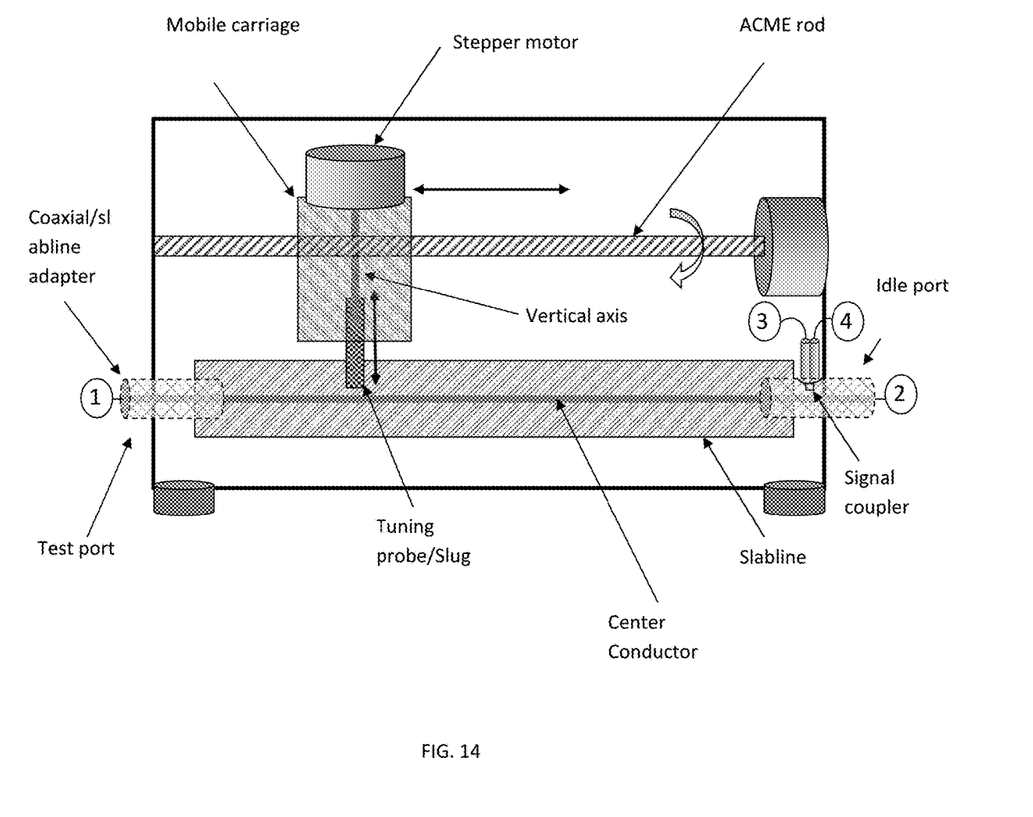
FIG. 14 depicts integration of coupler in impedance tuner with the coupler mounted on the idle port side.

The compactness and coaxial compatibility of the new coupler allows integrating in an impedance tuner, see FIG. 12. The tuner itself has a slabline as the main transmission line, but, since all interconnections between equipment are coaxial, it requires two coax-to-slabline adapters on each of its ports, the test and the idle port, to match the slabline environment to the coaxial one. The sex of the coaxial adapters is chosen to match the adjacent equipment for using a minimum of equipment interconnections. All tuners use this technique. The tuner may have one or more mobile carriages, each carriage having a remotely controlled precision vertical axis carrying tuning probes (slugs). The coupler is mounted inside a sole in the mantle of the coaxial to slabline adapter (FIG. 13), either on the test port side (FIG. 12) or on the idle port side (FIG. 14). Measurement is possible in both cases using appropriate calibration and corrections. However mounting on the idle port side (FIG. 14) will allow a reduced amount of signal to reach the coupler because of the loss of the tuner, especially when it tunes at high VSWR; this creates increased demand on receiver sensitivity and dynamic range. Mounting the compact coupler on the coax-slabline adapter has no further negative impact on tuner design and performance when mounted either on the side of the test or the idle port: The total slabline length, and thus the size of the tuner housing, is the same and the small residual see reflection of the coupler is easily taken care of in the measurement corrections. It must be noted that the length of the slabline is inverse proportional to the lowest frequency of operation: at Fmin=1 GHz we need approximately a 15 cm slabline, at 0.5 GHz we need 30 cm; the slabline length, for single probe tuners, is approximately one half of the wavelength long, for two-probe tuners the double and for three-probe tuners the triple. The wavelength is λ[cm]=300/F[GHz], F being the frequency of operation. The small residual see reflection caused by the coupler affects both methods of mounting, test- and idle-port side and must be taken into account by calibration in both cases.

This invention discloses preferred embodiments of adjustable signal-coupling sensors to be used in measuring injected and extracted RF signals from DUT's. The adjustable signal couplers can be cascaded with impedance controlling devices, such as impedance tuners or be integrated inside the tuner's housings.

Obvious alternatives of the disclosed embodiments of the adjustable coaxial coupler shall not impede on the reach of the invention. Obviously modified or re-arranged algorithms for calibration of the network analyzers and de-embedding and for arranging the internal see reference planes of the assembly shall not impede on the invention itself.

What I claim as my invention is:

1. A signal coupler comprising a coaxial airline, input port, output port, coupled port and isolated port and an electromagnetic "U" form loop sensor, said sensor having a bottom section and two branches,
   wherein
      the branches of the loop sensor extend into forming the center conductor of coaxial cables,
      one branch terminating as coupled port and the other branch terminating as isolated port, and wherein
      the loop sensor is inserted perpendicularly through a hole in a mantle of the airline.

2. An assembly comprising the signal coupler as in claim 1 and an impedance tuner, said tuner comprising at least
   coaxial test and idle ports, and
   a slotted airline (slabline) with two sidewalls and a center conductor between the ports,
   wherein the signal coupler forms a coaxial-to-slabline adapter connected to the test or idle ports.

3. The signal coupler as in claim 1,
   wherein
      the coupling factor is adjustable.

4. The signal coupler as in claim 1,
   wherein
      the distance between the loop sensor and a center conductor of the coaxial airline is adjustable.

5. The signal coupler of claim 1
   wherein
      the loop sensor has a surface and a rotation axis,
      said rotation axis being perpendicular to the bottom section of the loop and parallel to and
      centered between the two branches of the loop,
   and wherein
      the angle between the surface of the loop sensor and an axis of the airline is adjustable.

* * * * *